United States Patent
Zommer

[11] Patent Number: 5,187,117
[45] Date of Patent: Feb. 16, 1993

[54] SINGLE DIFFUSION PROCESS FOR FABRICATING SEMICONDUCTOR DEVICES

[75] Inventor: Nathan Zommer, Los Altos, Calif.
[73] Assignee: IXYS Corporation, San Jose, Calif.
[21] Appl. No.: 833,603
[22] Filed: Feb. 11, 1992

Related U.S. Application Data

[63] Continuation of Ser. No. 664,580, Mar. 4, 1991, abandoned.

[51] Int. Cl.$^5$ .................. H01L 21/22; H01L 21/266
[52] U.S. Cl. .................................... 437/151; 437/30; 437/149; 148/DIG. 126
[58] Field of Search ................ 437/27, 28, 29, 30, 437/149, 150, 151, 152, 153, 154, 157; 148/DIG. 82, DIG. 126

[56] References Cited

U.S. PATENT DOCUMENTS

Re. 32,800 12/1988 Han et al. .............................. 437/27
4,456,488 6/1984 Gahle .................................. 437/149
4,697,333 10/1987 Nakahara .................... 148/DIG. 82
5,023,191 6/1991 Sakurai .................................. 437/27

FOREIGN PATENT DOCUMENTS 0168282 10/1983 Japan .................................. 437/27
0296342 12/1990 Japan ........................ 148/DIG. 126

*Primary Examiner*—Brian E. Hearn
*Assistant Examiner*—C. Chaudhari
*Attorney, Agent, or Firm*—Townsend and Townsend

[57] ABSTRACT

A simplified process of making an insulated gate transistor entails forming the active regions in a single diffusion step. The method includes the steps of implanting and diffusing impurities of a first conductivity type (p for n-channel devices), implanting and diffusing a heavy dose of impurities of the same conductivity type (p+ for n-channel devices), and implanting and diffusing impurities of the other conductivity type (n+ for n-channel devices), wherein the three types of impurities are diffused at the same time in the same step. In a preferred embodiment of an n-channel process, the p-type dopant is boron and the n-type is arsenic.

8 Claims, 2 Drawing Sheets

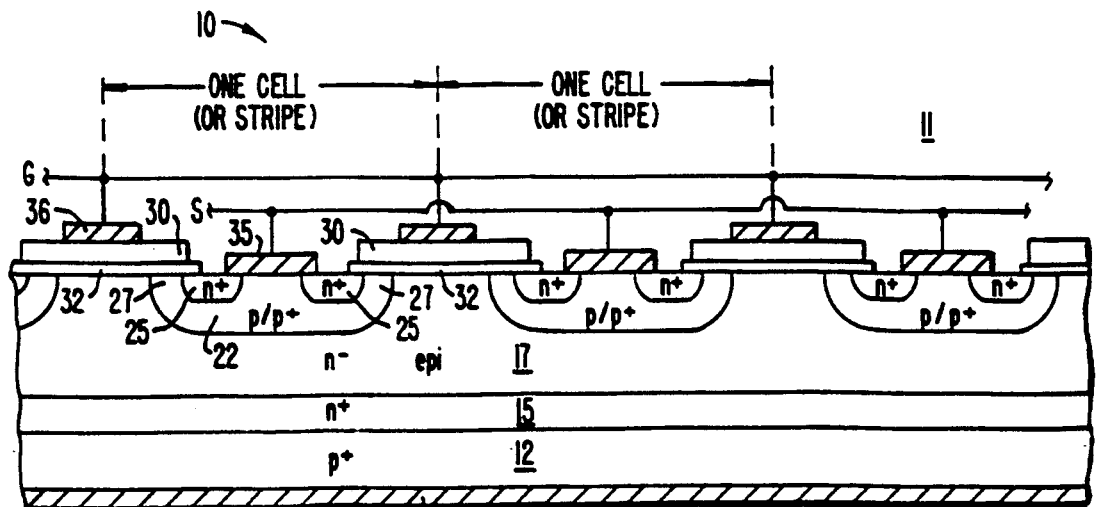
FIG._1A. PRIOR ART
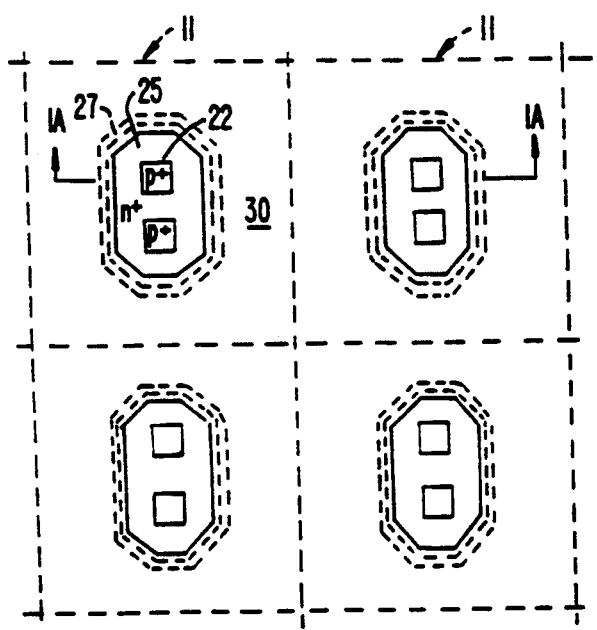
FIG._1B. PRIOR ART
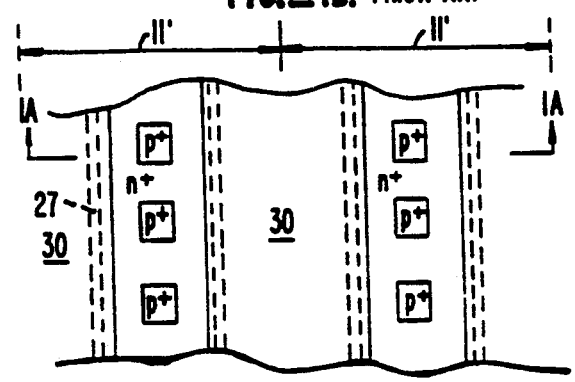
FIG._1C. PRIOR ART

SINGLE DIFFUSION PROCESS FOR FABRICATING SEMICONDUCTOR DEVICES

This is a continuation of application Ser. No. 07/664,580 filed Mar. 4, 1991, now abandoned.

BACKGROUND OF THE INVENTION

The present invention relates generally to semiconductor processing, and more specifically to a method for making insulated gate transistors, including insulated gate field effect transistors (IGFETs) and insulated gate bipolar transistors (IGBTs).

The prior art will be described in terms of fabricating an n-channel enhancement mode power IGFET. IGFETs are often referred to as MOSFETs (metal-oxide-semiconductor field effect transistors), even though most modern IGFETs have polysilicon rather than metal gates. Further, the initial discussion will be limited to embodiments where the transistor comprises a large number of microscopically small cells, each defining a microscopic active device.

The device is fabricated by diffusing impurities into selected regions of an n− epitaxial (epi) layer formed on an n+ substrate. A typical cell comprises a p/p+ body (sometimes referred to as the p-well) formed in the epi layer and an n+ source region formed within the perimeter of the body. The body is p-type over most of its lateral extent but one or more central regions are doped p+. The portion of the body adjacent the surface and between the source region and the n− epi layer defines a channel region.

A polysilicon layer overlies the channel region of each cell and the regions between cells, and is separated from the epi surface by a thin layer of gate oxide. The polysilicon layer forms a common gate electrode for all the cells in the device. Portions of a top metal layer connect the source regions to a common source node while other portions of the top metal layer connect the polysilicon layer to a common gate node. A metal layer is formed on the bottom surface to form a common drain node.

Known technologies for fabricating insulated gate transistors entail multiple diffusions of impurities to define the active regions of the device. The process most commonly used in the industry is a three-diffusion process wherein the p+ portion of the p-well is diffused, followed by gate oxidation and other oxidation and deposition steps. The second diffusion step is then performed to create the larger p-well area, which is usually self-aligned to the polysilicon gate region. Then, the third diffusion step is performed to create the n+ source region. A two-diffusion manufacturing process is disclosed in U.S. Pat. No. 4,860,072, issued Aug. 22, 1989. In this process, the p-well is formed by two separate deposition steps but a single diffusion step.

SUMMARY OF THE INVENTION

The present invention provides a simplified process of making semiconductor devices, providing increased yield, reduced cycle time, and reduced energy and gas costs. The process utilizes existing VLSI processing techniques and can easily be incorporated into existing fabrication facilities.

In brief, the process of the invention entails forming all or at least three of the active regions of the device in a single diffusion step. Thus, in the context of making insulated gate transistors, the method includes the steps of implanting and diffusing impurities of a first conductivity type (p for n-channel devices), implanting and diffusing a heavy dose of impurities of the same conductivity type (p+ for n-channel devices), and implanting and diffusing impurities of the other conductivity type (n+ for n-channel devices), wherein the three types of impurities are diffused at the sam time in the same step. Thus, all dopants are introduced sequentially with their corresponding masking steps in between, but there are no intervening diffusion steps. The single diffusion step forms the body and the source regions.

In a preferred embodiment of an n-channel process, the p-type dopant is boron and the n-type is arsenic. During the diffusion step, the fast diffusing boron diffuses more deeply and spreads laterally more than the slow diffusing arsenic. Accordingly, the p-well and the n+ source regions are well defined with a controlled channel thickness. The p, p+, and n+ implantation doses, and the time and temperature of the diffusion allow the device to be optimized based on speed and voltage rating considerations.

A further understanding of the nature and advantages of the present invention may be realized by reference to the remaining portions of the specification and the attached drawings.

BRIEF DESCRIPTION OF THE DRAWINGS

FIG. 1A is a schematic cross-sectional view of a prior art IGFET structure;

FIG. 1B is a top view showing a possible cell layout of the IGFET of FIG. 1A;

FIG. 1C is a top view showing a possible stripe layout of the IGFET of FIG. 1A;

DESCRIPTION OF SPECIFIC EMBODIMENTS

Figure 2A:
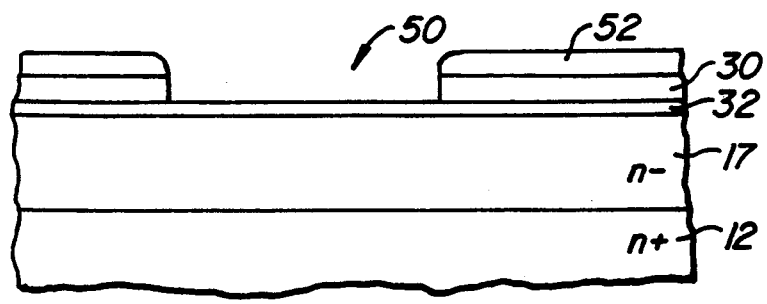
FIGS. 2A–2E are schematic cross-sectional views illustrating the multiple implantations and single diffusion according to the present invention.

Prior Art Device Structure and Fabrication Method

FIG. 1A is a simplified sectional view of portions of a prior art insulated gate field effect transistor (IGFET) chip 10. As shown in FIG. 1B and as will be discussed below, the active area of a typical chip may consist of hundreds or thousands of microscopically small cells 11, each defining an active device. For the IGFET shown, all the cells are the same and are connected in parallel. As shown in FIG. 1C, the chip may be laid out in microscopically narrow stripes 11' rather than cells.

An n+ substrate 12 has an n− epitaxial (epi) layer 17 formed on its upper surface, and the active regions are formed therein. A typical cell 11 of the IGFET comprises a p/p+ body 22 formed in epi layer 17 and an n+ region 25 formed within the perimeter of body 22. Body 22 is p-type over most of its lateral extent with one or more central regions doped p+. The portion of body 22 adjacent the surface and between the source region and the n− epi layer defines a channel region 27.

A polysilicon layer 30 overlies the channel region and the regions between cells, and is separated from the epi surface by a thin layer 32 of gate oxide. The polysilicon extends over the surface of the device with an opening at each cell (for source/body contacts) so as to form a common gate electrode for all the cells in the device. Portions 35 of a top metal layer connect n+ region 25 to a common source/body node S. Other portions 36 of the top metal layer connect the polysilicon layer to a common gate node G. A metal layer 37 is formed on the bottom surface of the substrate to form a bottom drain electrode D common to all cells of the device.

FIG. 1B shows a simplified top view of a typical layout of an embodiment laid out in cells 11. The solid octagon denotes the opening in the gate polysilicon layer while the dashed lines show the channel region under the gate (bounded by the p-well boundary and the source region boundary). This particular type of cell has the n+ source region formed so that the body portion contacts the epi surface in two regions (denoted by solid rectangles). The contact opening for the source/body contact extends over both these regions and the intermediate n+ region. This type of cell is described in U.S. Pat. No. 4,860,072, issued Aug. 22, 1989.

FIG. 1C shows a simplified top view of an embodiment laid out in stripes 11'. In this embodiment, the p-well, channel, and source region extend longitudinally.

A representative prior art fabrication process for n—channel IGFETs may be briefly outlined as follows:
(1) Provide an N+ substrate.
(2) Grow n— epitaxial layer.
(3) Grow localized field oxide to define peripheral non-active areas of the chip.
(4) Deposit gate oxide.
(5) Deposit polysilicon over gate oxide.
(6) Create openings in the polysilicon and gate oxide to define the cells or stripes.
(7) Implant p-type dopants aligned to polysilicon openings.
(8) Mask and implant p+ regions within the openings (non-critical alignment).
(9) Diffuse to form p-well (body).
(10) Mask at least portions of p+ diffusion and implant n+.
(11) Diffuse to form source regions and channel regions.
(12) Deposit CVD oxide over wafer.
(13) Etch poly contacts and source/body contacts.
(14) Deposit metal layer.
(15) Etch metal layer to define gate electrode and source/body electrode.
(16) Passivate.

The process can be used to make either IGFETs or IGBTs. IGBTs could be made by the above process, modified by providing a p+ substrate and then optionally doping the upper portion of the p+ substrate n+ prior to growing the n— epitaxial layer.

Fabrication Method According to the Invention

Figure 2B:
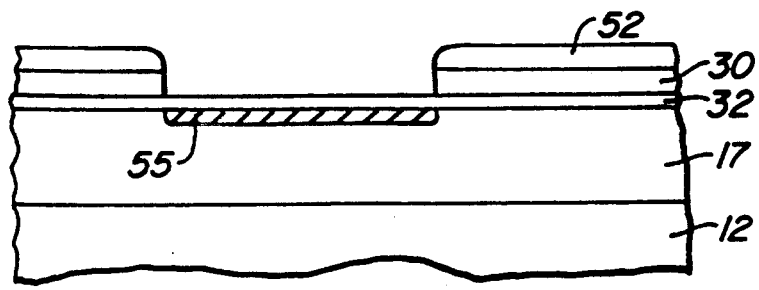

FIGS. 2A-B show schematic cross-sectional views of a portion of transistor chip 10 at various stages of the fabrication method according to the present invention. Where a figure illustrates the result of a particular implantation, the implant is shown with cross-hatching. It is assumed that field oxide is already on the device and patterned accordingly to define the active regions of the chip.

FIG. 2A shows the chip after gate oxide layer 32 and polysilicon layer 30 have been deposited on epi layer 17, and an opening 50 has been made in polysilicon layer 30 as defined by a patterned layer of photoresist 52.

FIG. 2B shows the chip after an implantation step has resulted in a region 55 of p-type impurities (preferably boron). This implantation is done with the polysilicon layer, either with or without photoresist 52, acting as the mask. The energy of the boron implant should be high enough to ensure that the boron atoms go through the gate oxide into the underlying silicon surface. A typical dose is $5 \times 10^{13}$ atoms/cm$^2$ at 140 KeV (or on the order of 50–100 KeV if the gate oxide was etched prior to implantation.

Figure 2C:
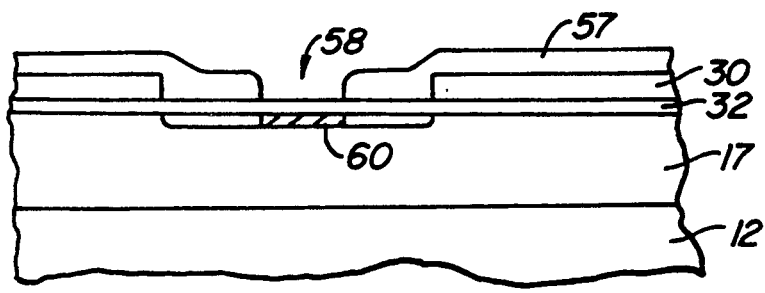

FIG. 2C shows the chip after photoresist 52 has been stripped, a photoresist layer 57 has been deposited, one or more openings 58 have been formed within the polysilicon opening for the p+ implant, and a heavy dose of p-type impurities has been implanted through opening(s) 58 to provide a resultant implanted area 60. This implant is at a higher dose (say $2 \times 10^{15}$ atoms/cm$^2$ than the first implant but generally at comparable energy. However, depending on the implanter, it may be necessary to perform the implantation at a somewhat lower energy to achieve the high dose.

Figure 2D:
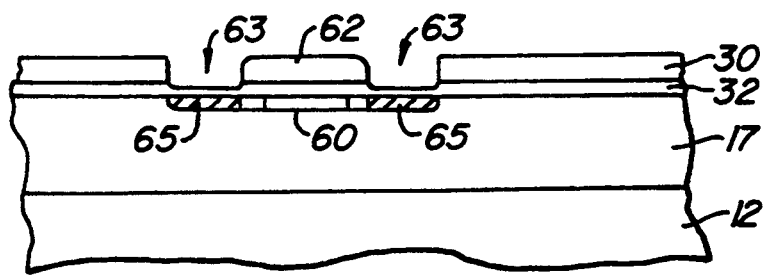

FIG. 2D shows the chip after photoresist 57 has been stripped, a patterned layer of photoresist 62 has been deposited to cover p+ region(s) 60, so as to leave an opening 63, and a heavy dose of n-type impurities (preferably arsenic) has been implanted through opening 63 to provide a resulting implanted area 65. The gate oxide is shown as having been etched to thin it prior to the implantation (it could also have been removed). Although two segments of opening 63 and region 65 appear in the figure, it should be understood that opening 63 and implanted region 65 extend along the entire periphery of the opening in the polysilicon, and thus are contiguous on the surface of the substrate.

The arsenic implant is shown as extending to the same depth as the boron implants, but it is possible, and sometimes desired, to make the implant shallower. A typical implant energy is 140 KeV, with lower values preferred for shallower implants. The arsenic inherently requires higher energy to penetrate the gate oxide, which is the reason for preferably etching the oxide if it is not possible to achieve the energy necessary to penetrate it. A typical dose is $5 \times 10^{15}$ atoms/cm$^2$.

Figure 2E:
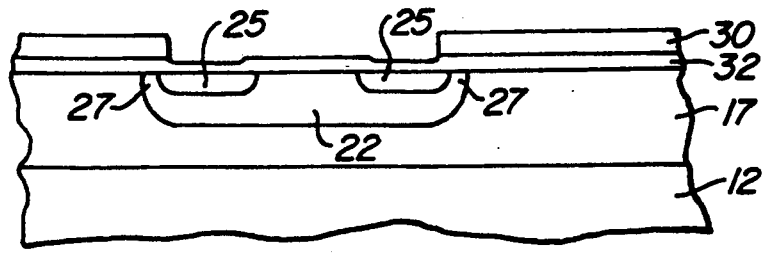

FIG. 2E shows the chip after photoresist 62 has been stripped and the wafer, with implants 55, 60, and 65 in place, has been subjected to a single diffusion step. The duration and temperature of the diffusion step are determined on the basis of the desired device parameters such as the voltage rating. This is carried out from 4 to 12 hours at temperatures generally in the range of 900°–1200° C. in an atmosphere such as nitrogen or nitrogen with traces of oxygen. The result of the diffusion step is to form p/p+ body 22, source region 25, and channel region 27. During the diffusion, the implanted boron atoms diffuse at a significantly higher rate than the arsenic atoms. Thus, they diffuse more deeply and more widely so as to define the channel. The width of the channel can thus be tailored for desired device characteristics.

The further processing steps, namely CVD oxide deposition, oxide etch for polysilicon and source/body contacts, metallization, metal etch, and passivation are standard and will not be described further.

Conclusion

In summary, it can be seen that the present invention renders the fabrication of insulated gate transistors more efficient through the elimination of all but a single diffusion step. There are no special masking steps required beyond those required in the prior art processes, and the process parameters are generally within the scope of the pre-existing processes.

While the above is a complete description of a number of embodiments, various modifications, alternatives, and equivalents may be used. For example, while the specific description is in terms of fabricating insulated gate transistors, at least some bipolar transistors and thyristors could also be made using a single diffusion step following three or more implantation steps. Moreover, while the specific implementation for insulated gate transistors is an n-channel process, the technique would be applicable to p-channel processes as well, so long as the dopants are chosen to have the correct relative diffusion rates. At present, known p-type dopants diffuse more rapidly than known n-type dopants, so the applicability to p-channel devices would appear limited. Therefore, the above description should not be taken as limiting the scope of the invention which is defined by the appended claims.

What is claimed is:

1. In a process of fabricating an insulated gate transistor having body and source regions, including the steps, performed after the deposition and patterning of a polysilicon layer, of (a) implanting and (b) diffusing impurities of one of two conductivity types, (c) implanting and (d) diffusing a heavy dose of impurities of the same conductivity type, and (e) implanting and (f) diffusing impurities of the other conductivity type, the improvement wherein:

said implanting steps (a), (c), and (e) are the only implanting steps performed in connection with forming the body and source regions said implanting steps (a), (c), and (e) are performed with no intervening high-temperature processing steps; and said diffusing steps (b), (d), and (f) are performed at the same time.

2. In an n-channel process of fabricating an insulated gate transistor having body and source regions, including the steps, performed after the deposition and patterning of a polysilicon layer, of implanting and diffusing p impurities, p+ impurities, and n+ purities, the improvement wherein:

all implanting steps for forming the body an source region, including said steps of implanting p impurities, implanting p+ impurities, and implanting n+ impurities, are performed after said deposition and patterning of the polysilicon layer and are performed with no intervening high-temperature processing steps; and said steps of diffusing p impurities, diffusing p+ impurities, and diffusing n+ impurities are performed at the same time.

3. A method of fabricating an insulated gate transistor comprising the steps of:

providing a semiconductor doped to a first conductivity type;

forming a gate oxide layer on the semiconductor;

forming a polysilicon layer on the gate oxide layer;

forming an opening in the polysilicon layer;

implanting impurities of a second conductivity type opposite the first conductivity type using the polysilicon as a mask;

implanting a heavy dose of impurities of the second conductivity type in a first portion of the region defined by the opening, the first portion being spaced inwardly from the periphery of the opening;

implanting a heavy dose of impurities of the first conductivity type in a second portion of the region defined by the opening, at least part of the second portion being disposed adjacent the periphery of the opening;

the second portion being generally non-overlapping with the first portion; and thereafter, performing a single diffusion step to define a well region of the second conductivity type and a source region of the cribs conductivity type;

all implanting steps for forming the p-well and source region, including said three implanting steps being performed with no intervening high-temperature processing steps.

4. The method of claim 3 wherein said three implanting steps are performed in the order recited.

5. A method of fabricating an insulated gate transistor comprising the steps of:

(a) providing an n-type semiconductor;

(b) forming a gate oxide layer on the semiconductor;

(c) forming a polysilicon layer on the gate oxide layer;

(d) forming an opening in the polysilicon layer to define a p-well area;

(e) implanting p-type impurities using the polysilicon as a mask;

(f) implanting p+ impurities within the region defined by the opening to establish at least one p+ region placed inwardly from the periphery of the opening;

(g) implanting n+]impurities within the region defined by the opening to establish at least an n+ region, at least a part of which extends along the periphery of the opening, the n+ and p+ regions being generally non-overlapping; and (h) thereafter, performing a single diffusion step to define a p-well and an n+ source region with the p-well;

all implanting steps for forming the p-well and source region, including said steps (e), (f), and (g) being performed with no intervening high-temperature processing steps.

6. The method of claim 5 wherein said steps (e), (f), and (g) are performed in the order recited.

7. The method of claim 5 wherein said step of providing an n-type semiconductor comprises the steps of:

providing an n+ substrate; and depositing an n− layer on the n+ substrate.

8. The method of claim 5 wherein each of said steps (d) through (h) is performed simultaneously over a plurality of discrete regions on the device.

* * * * *